US012733523B2

(12) United States Patent
Dai et al.

(10) Patent No.: US 12,733,523 B2
(45) Date of Patent: Sep. 8, 2026

(54) ELECTRONIC DEVICE AND MANUFACTURING METHOD THEREOF

(71) Applicant: InnoLux Corporation, Miao-Li County (TW)

(72) Inventors: Yan-Tang Dai, Miao-Li County (TW); Tzu-Min Yan, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 165 days.

(21) Appl. No.: 18/406,222

(22) Filed: Jan. 8, 2024

(65) Prior Publication Data

US 2024/0274543 A1 Aug. 15, 2024

(30) Foreign Application Priority Data

Feb. 13, 2023 (CN) ......................... 202310111006.5

(51) Int. Cl.

| | |
|---|---|
| ***H05K 1/02*** | (2006.01) |
| ***H05K 3/02*** | (2006.01) |
| ***H05K 3/06*** | (2006.01) |
| ***H10K 59/82*** | (2023.01) |
| ***H10W 70/60*** | (2026.01) |
| ***H10W 70/65*** | (2026.01) |

(Continued)

(52) U.S. Cl.
CPC .......... *H10W 70/65* (2026.01); *H05K 1/0298* (2013.01); *H05K 3/027* (2013.01); *H05K 3/064* (2013.01); *H10K 59/82* (2023.02); *H10W 70/611* (2026.01); *H05K 2201/09281* (2013.01); *H05K 2201/10098* (2013.01); *H05K 2203/107* (2013.01); *H10K 59/95* (2023.02); *H10W 90/00* (2026.01)

(58) Field of Classification Search
CPC ....... H05K 1/0298; H05K 2201/09281; H05K 2201/10098; H05K 2201/09145; H05K 1/144; H05K 2201/043; H05K 2201/09727; H05K 1/0296; H05K 1/11; H10W 90/00
USPC .......................................................... 174/261
See application file for complete search history.

(56) References Cited

U.S. PATENT DOCUMENTS

2014/0360765 A1* 12/2014 Kiwanami ............. H05K 1/185 174/260
2018/0031933 A1* 2/2018 Osawa ....................... B32B 7/04

(Continued)

FOREIGN PATENT DOCUMENTS

TW I751020 B 12/2021

*Primary Examiner* — Timothy J Thompson
*Assistant Examiner* — Sidi M Maiga
(74) *Attorney, Agent, or Firm* — Winston Hsu

(57) ABSTRACT

The disclosure discloses a manufacturing method of an electronic device, which comprises the following steps: providing a first substrate, providing a second substrate, bonding the first substrate and the second substrate through an adhesive layer, forming a conductive layer on the side surfaces of the first substrate, the second substrate and the adhesive layer, performing a first patterning process on a first region of the conductive layer, and performing a second patterning process on a second region of the conductive layer, the first region at least partially overlaps the adhesive layer, and the second region overlaps the side surfaces of the first substrate and the second substrate, and the first patterning process is different from the second patterning process.

3 Claims, 6 Drawing Sheets

(51) Int. Cl.
*H10K 59/95* (2023.01)
*H10W 90/00* (2026.01)

(56) References Cited

U.S. PATENT DOCUMENTS

2022/0052080 A1* 2/2022 Kim ...................... H01L 25/167
2022/0208952 A1 6/2022 Shin

* cited by examiner

ELECTRONIC DEVICE AND MANUFACTURING METHOD THEREOF

BACKGROUND OF THE DISCLOSURE

1. Field of the Disclosure

The present disclosure relates to an electronic device, in particular to an improved structure of a lateral wiring of an electronic device panel and a manufacturing method thereof, which can improve the quality of the lateral wiring.

2. Description of the Prior Art

In the current technology, different components are often fabricated on different substrates, and then more than two different substrates are combined with each other to form an electronic device. For example, when making a display panel, it is possible to make control circuits (transistors, etc.) and light-emitting elements (such as light-emitting diodes, etc.) on different substrates, and then combine the substrates with each other. The above method can effectively improve the efficiency and yield of the process, so it is widely adopted by the industry.

Generally speaking, lateral wiring is often used to electrically connect components on different substrates, that is to say, the wiring will electrically connect components on two substrates through the side surfaces of the substrates. However, the lateral wiring must pass through the adhesive layer between two substrates. Because the material characteristics of the adhesive layer are different from those of the substrates, various quality problems such as disconnection and impedance improvement are more likely to occur in the lateral wiring.

SUMMARY OF THE DISCLOSURE

In one embodiment, the present disclosure provides a manufacturing method of an electronic device, which includes providing a first substrate, providing a second substrate, bonding the first substrate and the second substrate through an adhesive layer, forming a conductive layer on the side surface of the first substrate, the side surface of the second substrate and the side surface of the adhesive layer, performing a first patterning process on a first region of the conductive layer, and performing a second patterning process on a second region of the conductive layer, the first region at least partially overlaps the adhesive layer, and the second region overlaps the side surface of the first substrate and the side surface of the second substrate, and the first patterning process is different from the second patterning process.

The disclosure also provides an electronic device, which comprises a first substrate, a second substrate, an adhesive layer arranged between the first substrate and the second substrate, and a lateral wiring arranged on the side surface of the first substrate and the side surface of the adhesive layer, wherein the lateral wiring having a first portion and a second portion. The first portion at least partially overlaps the adhesive layer, and the second portion overlaps the side surface of the first substrate, and the first portion and the second portion respectively have a first edge and a second edge extending along a first direction, the first edge and the second edge are separated from each other, and the first direction is the arrangement direction of the first substrate and the second substrate.

The disclosure also provides an electronic device, which comprises a first substrate, a second substrate, an adhesive layer arranged between the first substrate and the second substrate, and a lateral wiring arranged on the side surface of the first substrate and the side surface of the adhesive layer, the lateral wiring having a first portion and a second portion. The first portion at least partially overlaps the adhesive layer, and the second portion overlaps a part of the side surface of the first substrate, and the region of the side surface of the first substrate without the lateral wiring has a third region adjacent to the first portion and a fourth region adjacent to the second portion, and there is a height difference between the third region and the fourth region.

The feature of the present disclosure is to provide an electronic device including an improved lateral wiring and a manufacturing method thereof. The lateral wiring comprises a first portion covering the adhesive layer and a second portion covering the side surface of the substrate, the first portion and the second portion are formed by different processes, and in some embodiments, the width of the first portion is larger than the width of the second portion. By forming different portions of the lateral wirings in different ways, the lateral wirings can better adhere to the contours and seams of heterogeneous interfaces (i.e., the substrate and the adhesive layer), reduce the risk of lateral wirings breaking or resistance rising, and improve the quality of the overall electronic device.

These and other objectives of the present disclosure will no doubt become obvious to those of ordinary skill in the art after reading the following detailed description of the embodiment that is illustrated in the various figures and drawings.

DETAILED DESCRIPTION

Figure 1:
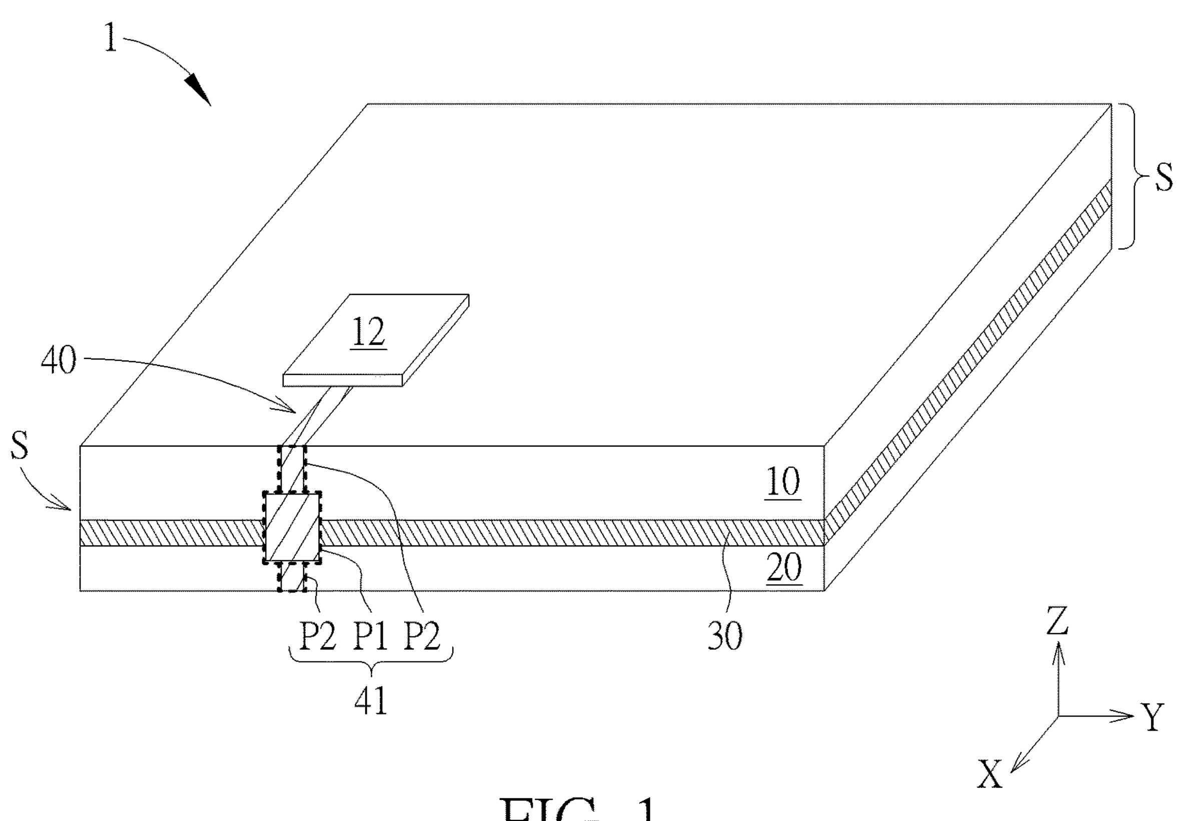
FIG. 1 shows a schematic structural diagram of an electronic device.

The present disclosure may be understood by reference to the following detailed description, taken in conjunction with the drawings as described below. It is noted that, for purposes of illustrative clarity and being easily understood by the readers, various drawings of this disclosure show a portion of an electronic device (i.e. a display device in this disclosure), and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

The "electrical connection" mentioned in this disclosure may include that two or more elements are in physical direct contact with each other and are conductive to each other; or two or more elements are not in direct contact with each other, but are connected with each other by other elements (such as wires, contact structures, etc.), all of which conform to the definition of electrical connection described in this disclosure.

It should be understood that when an element or film is said to be "on" or "connected to" another element or film, it can be directly on or directly connected to this other element or film, or there may be intervening elements or films between them. Conversely, when an element is said to be "directly on" or "directly connected to" another element or film, there is no intervening element or film between them.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. The electronic device disclosed in the present disclosure can include, for example, a display device, an antenna device, a sensing device, a touch display, a curved display or a free shape display, and can also be a bendable or flexibly spliced electronic device, but is not limited thereto. Electronic device may include, for example, light emitting diodes, liquid crystal, fluorescence, phosphorescence, quantum dot (QD), other suitable display media, or combinations of the foregoing, but are not limited thereto. The light-emitting diode (LED) may include, for example, an organic light-emitting diode (OLED), inorganic light-emitting diode, mini light-emitting diode (mini LED), micro light-emitting diode (micro LED) or quantum dot light-emitting diode (QDLED), or other suitable materials or any arrangement and combination of the above, but not limited thereto. The antenna device can be, for example, a liquid crystal antenna, but is not limited thereto. It should be noted that the electronic devices disclosed in this disclosure can be any combination of the above, but are not limited thereto. In addition, the appearance of the electronic device can be rectangular, circular, and polygonal, with curved edges or other suitable shapes. An electronic device may have peripheral systems such as a driving system, a control system, a light source system, a shelf system, etc. to support a display device or an antenna device. Hereinafter, the display device will be used as an example.

In this disclosure, the measurement methods of length, thickness, width, height, distance and area can be obtained by optical microscope (OM), electron microscope (such as scanning electron microscope, SEM)) or other methods, but not limited thereto.

Please refer to FIG. 1, FIG. 1 shows a schematic structural diagram of an electronic device. As shown in FIG. 1, the present disclosure provides an electronic device, and its electronic device 1 includes a first substrate 10 and a second substrate 20, which are interconnected by an adhesive layer 30. The first substrate 10 may include electronic components 12, and the second substrate 20 may also include electronic components (the electronic components may be located below the second substrate 20 in FIG. 1, so they are not shown in FIG. 1). A conductive layer 40 connects the electronic components 12 on the first substrate 10 and the electronic components (not shown) on the second substrate 20, the electronic device 1 includes a side surface S, namely, the side surface of the first substrate 10, the side surface of the second substrate 20 and the side surface of the adhesive layer 30. A part of the conductive layer 40 is disposed on the side surface S. In one embodiment, the part of the conductive layer 40 is patterned to form a lateral wiring 41. According to some embodiments, the conductive layer 40 covers the side surface S. In this embodiment, the first substrate 10 or the second substrate 20 may include multiple side surfaces, and the lateral wirings 41 may be located on one or more of these side surfaces, which are within the scope of the present disclosure. The first substrate 10 and the second substrate 20 may be, for example, a soft substrate or a hard substrate, the soft substrate may be, for example, a polyimide Film substrate, and the hard substrate may be, for example, glass. The adhesive layer 30 can be, for example, acrylic resin, epoxy resin, optically clear adhesive (OCA) or optically clear resin (OCR), and the thickness can be, for example, 10-30 microns, 30-50 microns, 50-100 microns, etc., but not limited thereto. The side surface S may be parallel to the normal direction (Z-axis direction) of the first substrate 10 and the second substrate 20, for example.

As mentioned above, the lateral wirings 41 are generally used in electronic devices where two or more substrates are combined. However, because the substrates (including the first substrate 10 and the second substrate 20 in this embodiment) and the adhesive layer 30 have different material characteristics, such as thermal deformation temperature, thermal conductivity, etching rate, etc., and there may be a height difference between their side surfaces after assembly, the formation quality of the lateral wirings 41 formed on different materials will also be affected. In other words, if the lateral wiring 41 is formed by a single process, it is easy to produce defects at the interface of different materials, such as fracture or impedance increase.

Therefore, this disclosure is characterized in that the lateral wiring 41 is formed by two different processes, and the lateral wiring 41 is divided into two portions according to the different processes, which can be at least roughly divided into a portion covering the side surface of the adhesive layer 30 and another portion covering part of the side surface of the substrates, which are made by different processes respectively. Furthermore, the lateral wiring 41 of this embodiment may include a first portion P1 and a second portion P2 (as shown in FIG. 1), wherein the first portion P1 at least partially overlaps or covers the side surface of the adhesive layer 30 in the X direction, while the second portion P2 overlaps a part of the side surface of the first substrate 10 or the second substrate 20, and the second portion P2 may not overlap the side surface of the adhesive layer 30. The first portion P1 and the second portion P2 are respectively formed by different patterning processes, that is to say, each patterning process can select a different conductive layer forming process, which can include, for example, patterning photoresist process, lift-off process, wet etching, dry etching, laser ablation and other processes (in another embodiment, the laser wavelength used for laser ablation can include, for example, 400 nm-700 nm), to form the first portion P1 of the lateral wiring 41 on the side surface of the adhesive layer 30 and the second portion P2 of the lateral wiring 41 on the side surface of the first substrate 10 (or the second substrate 20) in sequence, and electrically connect with each other to form a complete lateral wiring 41. It should be emphasized that the order of formation of the first portion P1 and the second portion P2 can be, for example, the first portion P1 is completed before the second portion P2, or the second portion P2 is completed before the first portion P1, or complete the first portion P1 and the second portion P2 at the same time. According to the different material characteristics of the substrate and the adhesive layer, different processing methods can be selected, so that the lateral wiring 41 can be better formed and the influence of the bottom material on the quality of the lateral wiring 41 can be reduced.

The methods for forming the first portion P1 and the second portion P2 of the lateral wiring 41 described here include, but are not limited to, a photo lithography process, a lift-off process, laser ablation, and the like. In this embodiment, the methods of forming the first portion P1 and the second portion P2 are different. For example, the first portion P1 can be formed by a lift-off process and the second portion P2 can be formed by a laser ablation process, or the first portion P1 can be formed by a laser ablation process and the second portion P2 can be formed by a lift-off process. In addition, in another embodiment, the time sequence of forming the first portion P1 and the second portion P2 can also be reversed. But the present disclosure is not limited thereto.

Figure 2:
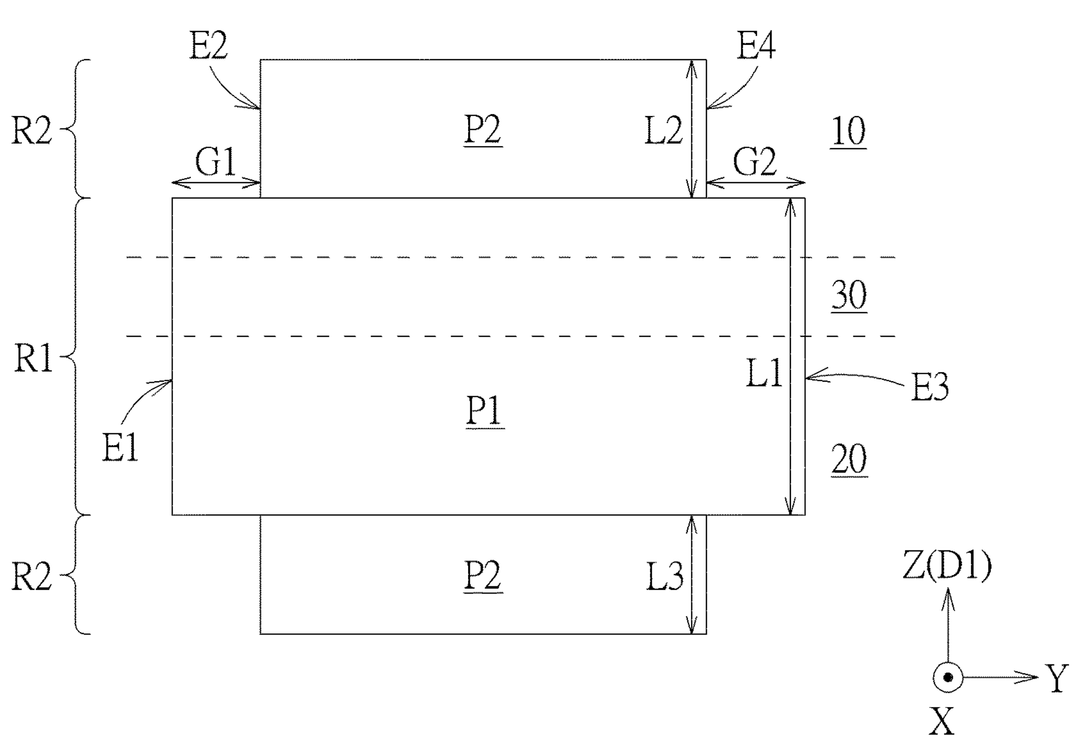
FIG. 2 shows a partial side view of an electronic device of the present disclosure.

FIG. 2 shows a partial side view of an electronic device of the present disclosure. As shown in FIG. 2, the conductive layer 40 includes a first region R1 and a second region R2, the first region R1 may correspond to the side surface of the adhesive layer 30 and a part of the side surface of the first substrate 10 or the second substrate 20, and the second region R2 corresponds to a part of the side surface of the first substrate 10 or the second substrate 20. In some embodiments, the first region R1 and the second region R2 are adjacent to each other in the Z direction. The second region R2 can be defined by, for example, a distance of 100 um from the first substrate 10 or the second substrate 20 to the adhesive layer 30 in the parallel Y direction, and the first region R1 is defined as a range between the second region R2 of the first substrate 10 and the second region R2 of the second substrate 20, but not limited thereto. The lateral wiring 41 passes through the side surface of the electronic device, and the lateral wiring 41 comprises a first portion P1 and a second portion P2, the first portion P1 corresponds to the first region R1, the first portion P1 at least partially covers or overlaps the side surface of the adhesive layer 30, and the second portion P2 corresponds to the second region R2, and the second portion P2 overlaps a part of the side surface of the first substrate 10 or the second substrate 20, that is to say, the second portion P2 may not overlap the side surface of the adhesive layer 30. In this embodiment, the first portion P1 and the second portion P2 can be formed by different patterning processes. For example, the first portion P1 is patterned by wet etching, and the second portion P2 is patterned by laser ablation. Both the formed first portion P1 and the formed second portion P2 are electrically connected to each other to form a complete lateral wiring 41. In this embodiment, wet etching and laser etching are selected to pattern the first portion P1 and the second portion P2 respectively, because the first portion P1 is patterned by wet etching, which is more in line with the material characteristics of the adhesive layer 30, and the second portion P2 is close to the side edges of the first substrate 10 or the second substrate 20 (i.e., the upper and lower edges in FIG. 2). If patterned by wet etching in this region, it is easy to form overflow regions and cause uneven film thickness of the second portion P2, so the second portion P2 is etched by laser. It should be noted, however, that the above-mentioned selection of wet etching and laser ablation is only one example of this disclosure, and this disclosure is not limited to this, that is to say, the first portion P1 and the second portion P2 can still be patterned by other methods, which is also within the scope of this disclosure.

In addition, in this embodiment, the first portion P1 and the second portion P2 may have different line widths, which are the length of the lateral wiring 41 in the direction perpendicular to the first direction D1, which is parallel to the arrangement direction of the first substrate 10 and the second substrate 20. Take FIG. 2 as an example, the line widths are the length of the lateral wiring 41 in the Y direction. In one embodiment, the line width of the first portion P1 and the line width of the second portion P2 have a proportional relationship of, for example, 1:1.2, 1:1.3, 1:1.4, and 1:1.5. It should be particularly emphasized that the line width of the first portion P1 is larger than that of the second portion P2, but the line width of the second portion P2 may be larger than that of the first portion P1. As shown in FIG. 2, the first portion P1 has a first edge E1, and the second portion P2 has a second edge E2. In addition, a third edge E3 of the first portion P1 and a fourth edge E4 of the second portion P2 are defined. The first edge E1 is opposite to the third edge E3, and the second edge E2 is opposite to the fourth edge E4, and the first edge E1, the second edge E2, the third edge E3 and the fourth edge E4 are all arranged in the same direction. For example, as shown in FIG. 2, the first edge E1, the second edge E2, the third edge E3 and the fourth edge E4 are arranged along the Z direction in FIG. 2, wherein the Z direction is parallel to the arrangement direction of the first substrate 10 and the second substrate 20. Besides, because the line widths of the first portion P1 and the second portion P2 are different, there is a first pitch G1 between the first edge E1 and the second edge E2, which may be, for example, between 5 and 15 microns, but is not limited to this. In addition, the ratio of the first pitch G1 to the line width of the first portion P1 may be $\frac{1}{10}$~$\frac{1}{5}$, $\frac{1}{5}$~$\frac{1}{3}$, $\frac{1}{3}$~$\frac{1}{2}$, but it is not limited to this. Similarly, there is a second pitch G2 between the third edge E3 and the fourth edge E4, which may be, for example, between 5 and 15 microns, but is not limited to this. In addition, the ratio of the second pitch G2 to the line width of the first portion P1 may be $\frac{1}{10}$~$\frac{1}{5}$, $\frac{1}{5}$~$\frac{1}{3}$, $\frac{1}{3}$~$\frac{1}{2}$, but it is not limited to this. However, the first pitch G1 and the second pitch G2 can be symmetrically arranged or slightly deviated, so the difference between the first pitch G1 and the second pitch G2 is greater than or equal to zero. In addition, in this embodiment, a length L1 of the first portion P1 along the Z direction is more than 600 microns, and a first distance L2 between the first portion P1 and the edge of the first substrate 10 away from the second substrate 20, or a second distance L3 between the first portion P1 and the edge of the second substrate 20 away from the first substrate 10 can be more than 80 microns. However, it is worth noting that the parameter range provided above is only one example of this disclosure, and the actual parameters can still be adjusted according to the thickness of the substrate and the adhesive layer or the product requirements, and this disclosure is not limited to this.

Figure 3:
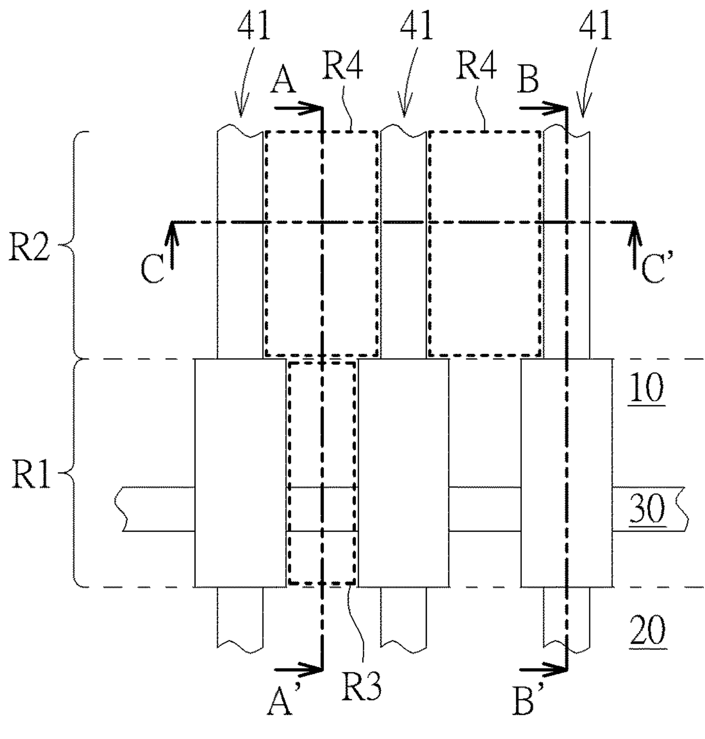
FIG. 3 shows a partial side view of an electronic device of the present disclosure.
Figure 3:
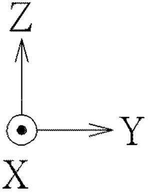
Figure 4:
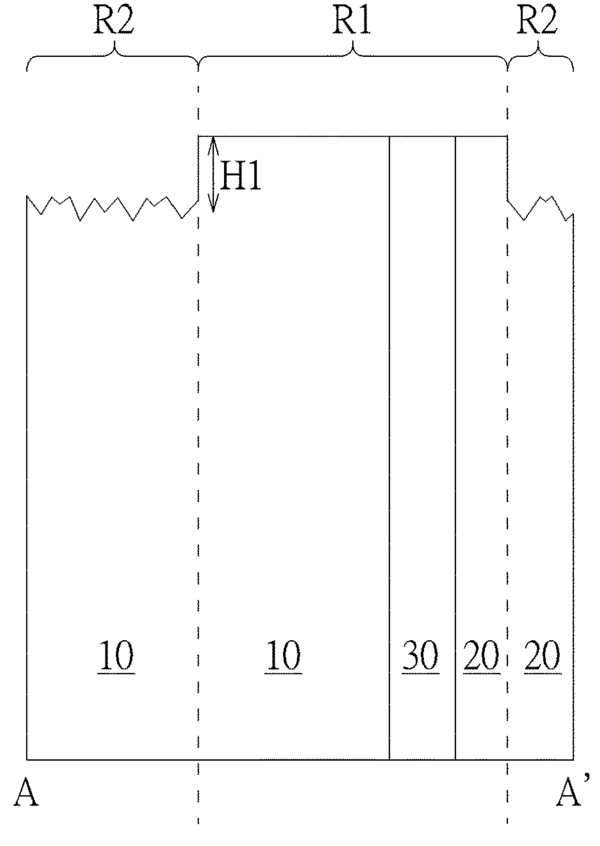
FIG. 4 is a sectional view taken along section line A-A' of FIG. 3.
Figure 4:
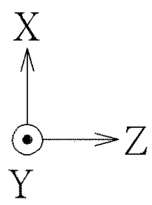
Figure 5:
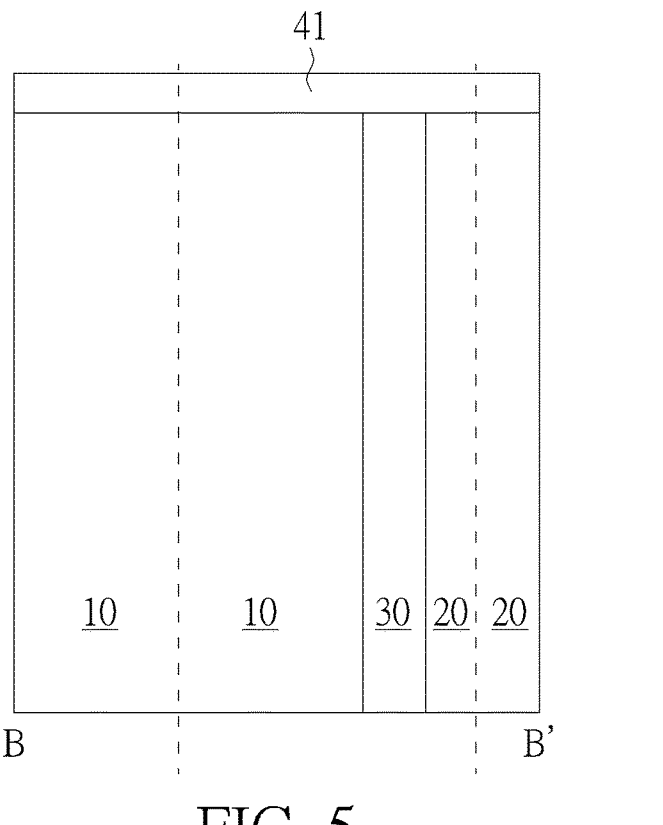
FIG. 5 is a sectional view taken along the section line B-B' of FIG. 3.
Figure 6:
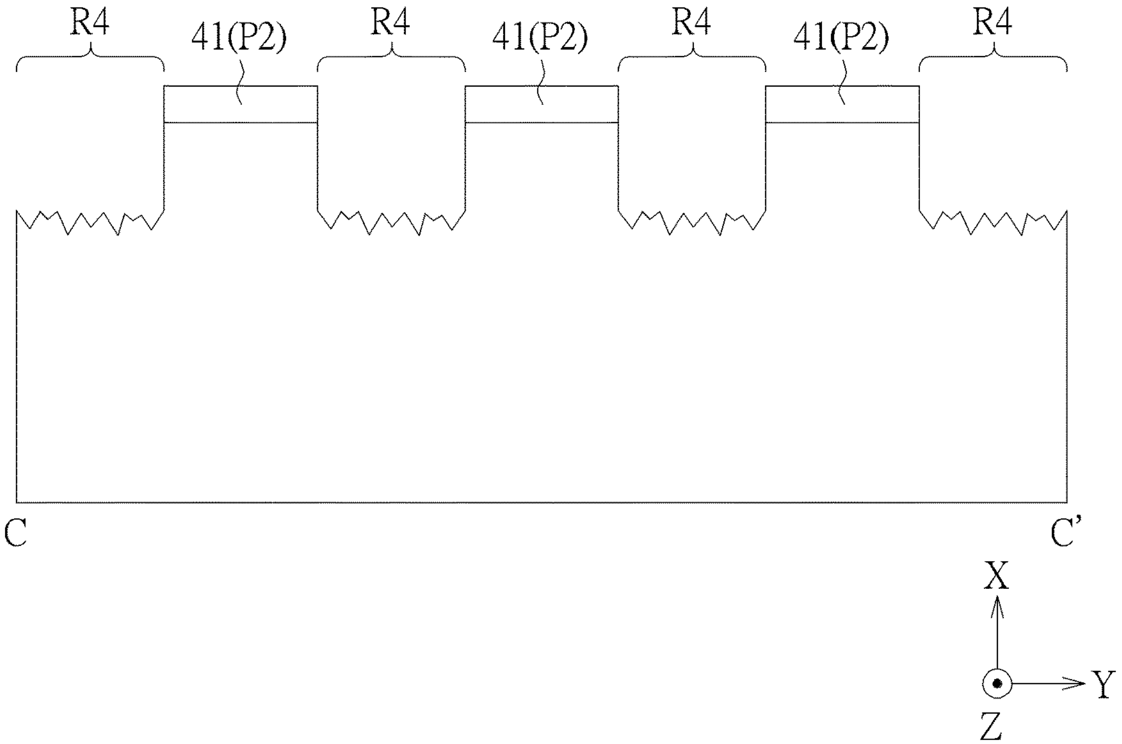
FIG. 6 is a sectional view taken along the section line C-C' of FIG. 3.

FIG. 3 shows a partial side view of an electronic device of the present disclosure, FIG. 4 shows a cross-sectional view taken along section line A-A' of FIG. 3, FIG. 5 shows a cross-sectional view taken along section line B-B' of FIG. 3, and FIG. 6 shows a cross-sectional view taken along section line C-C' of FIG. 3. As shown in FIG. 3, a plurality of lateral wirings 41 are arranged on the side surface of the first substrate 10, the side surface of the second substrate 20 and the side surface of the adhesive layer 30. In this embodiment, taking the first portion P1 is patterned by wet etching, and the second portion P2 is patterned by laser ablation as an example. As shown in FIG. 4, after the first patterning process and the second patterning process are completed, the first substrate 10 or the second substrate 20 not covered by the lateral wirings 41 at the first portion P1 is defined as a third region R3, and the first substrate 10 or the second substrate 20 not covered by the lateral wirings 41 at the second portion P2 is defined as a fourth region R4. Therefore, after the laser ablation, since the third region R3 is not subjected to laser ablation (the first portion P1 next to it is patterned by wet etching), the third region R3 will not become rough. On the other hand, the fourth region R4 is affected by the laser ablation (the second portion P2 next to it is patterned by laser ablation), so the surface of the fourth region R4 also becomes rough. As shown in FIG. 4, there is a height difference H1 between the third region R3 and the fourth region R4. In one embodiment, the difference H1 can be determined by the distance in the X direction between any position taken on the third region R3 of the first substrate 10 and any position taken on the fourth region R4 of the first substrate 10. In another embodiment, the height difference H1 can be determined by the distance in the X direction between the second substrate 20 between any position taken on the third region R3 of the second substrate 20 and any position taken on the fourth region R4 of the second substrate 20. In this embodiment, the height of the height difference H1 can be less than 10 microns, but it is not limited to this, depending on the power of laser ablation, the thickness of the conductive layer and other factors, and the roughness of the fourth region E4 is greater than that of the third region E3, which can be observed by probes, optics and microscopes.

In addition, as shown in FIG. 5, since the first portion P1 and the second portion P2 of the lateral wiring 41 are conductive layers (the substrate is covered by the conductive layer), so they will not become rough after being etched by the laser. Therefore, after the respective patterning processes, the surfaces of the conductive layers covered on the flat side surface S of the original electronic device are still aligned and flat, so that the surface difference between the first portion P1 and the second portion P2 is less than 5 microns. As shown in FIG. 6, it can be seen that the part of the fourth region R4 becomes rough, while the region covered by the second portion P2 (the conductive layer) does not generate subsidence or rough surface.

Figure 7:
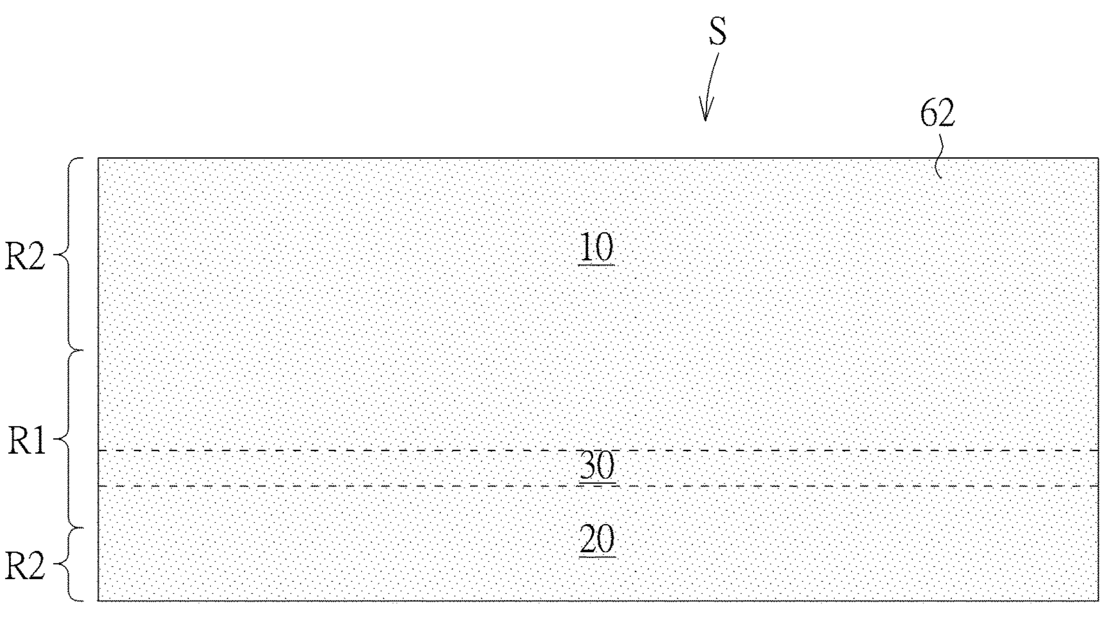
FIGS. 7-11 are schematic diagrams illustrating the formation of lateral wirings on the side surface of an electronic device according to an embodiment of the present disclosure.
Figure 7:
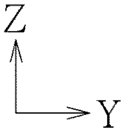

FIGS. 7-11 are schematic diagrams illustrating the formation of lateral wirings on the side surface of an electronic device according to an embodiment of the present disclosure. As shown in FIG. 7, the side surface S of the electronic device 1 is composed of the side surface of the first substrate 10, the side surface of the second substrate 20 and the side surface of the adhesive layer 30. The side surface S includes a first region R1 and a second region R2, and the first region R1 at least partially overlaps the adhesive layer 30. For example, in this embodiment, the first region R1 can overlap the whole adhesive layer 30, parts of the side surface of the first substrate 10 and parts of the side surface of the second substrate 20, while the second region R2 is adjacent to the first region, for example, the second region R2 may overlap parts of the side surface of the first substrate 10 and parts of the side surface of the second substrate 20, and may not overlap the adhesive layer 30. Next, a conductive layer (not shown) and a photoresist layer 62 are formed on the side surface S. It is worth noting that in this embodiment, the conductive layer is formed first and then the photoresist layer 62 is formed. However, since the conductive layer is covered by the photoresist layer 62, the conductive layer cannot be seen from FIG. 7.

Here, the conductive layer may contain metals and metal compounds with good conductivity such as copper, aluminum and silver, or other materials with good conductivity such as graphene. In addition, other metal layers such as molybdenum (Mo), titanium (Ti), gold (Au) and platinum (Pt) may be additionally formed before or after the formation of the conductive layer to improve adhesion or serve as an antioxidant layer. The exposed layers such as the photoresist layer 62 can be general wet photoresist, dry film photoresist, protective adhesive, etc. However, it should be noted that the above materials are only one example of this disclosure, and this disclosure is not limited to this.

Figure 8:
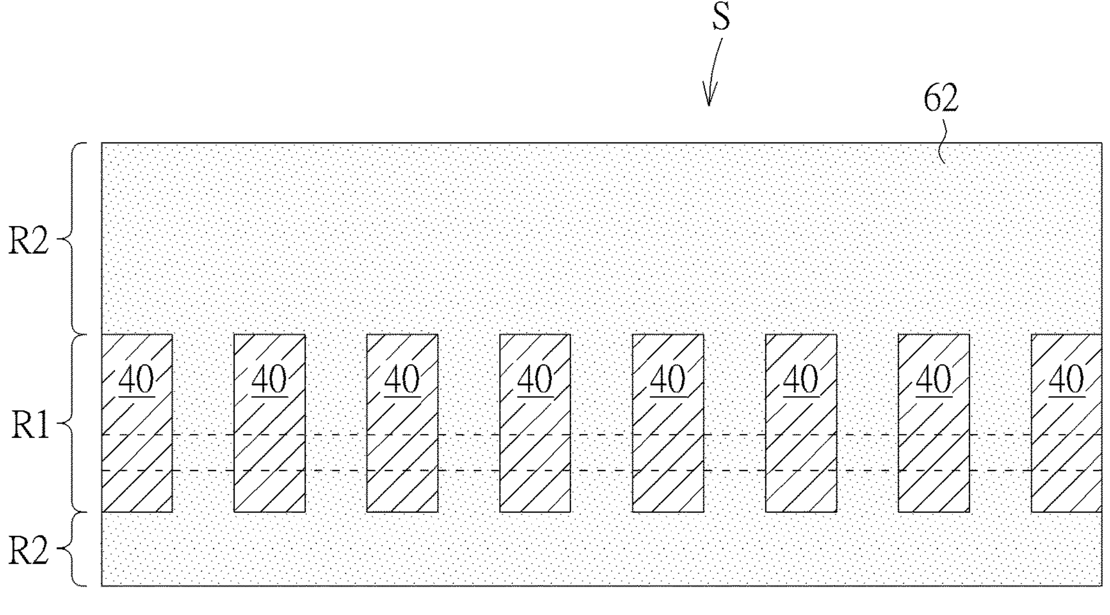
Figure 9:
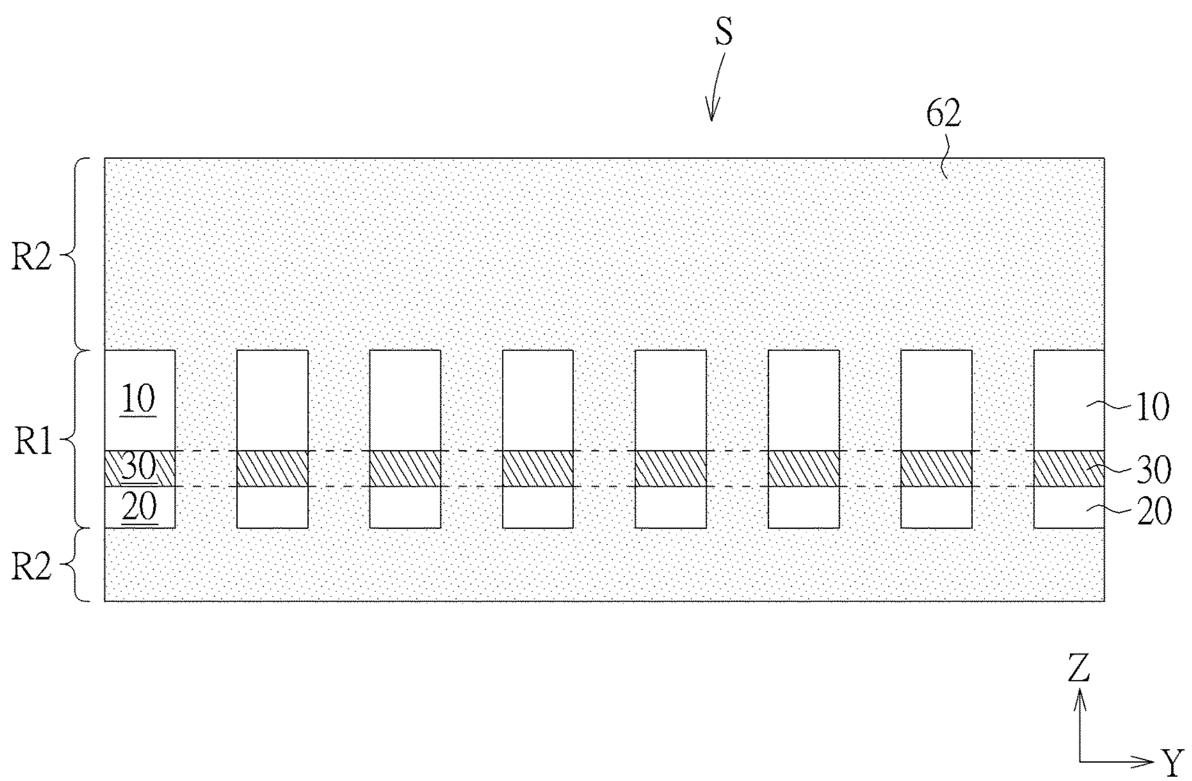

As shown in FIG. 8, a first patterning process step is performed in the first region R1 to remove a part of the photoresist layer 62 and expose the conductive layer 40 below the photoresist layer 62. The method of removing the photoresist layer 62 here is to use the development step in the photo lithography process. Next, as shown in FIG. 9, the exposed conductive layer 40 is removed by an etching step (for example, a wet etching step in this embodiment), and parts of the side surfaces of the first substrate 10, the second substrate 20 and the adhesive layer 30 are exposed. It is worth noting that the conductive layer 40 (covered by the photoresist layer 62) left in the first region R1 at this time will be the first portion of the lateral wiring in the subsequent step.

Figure 10:
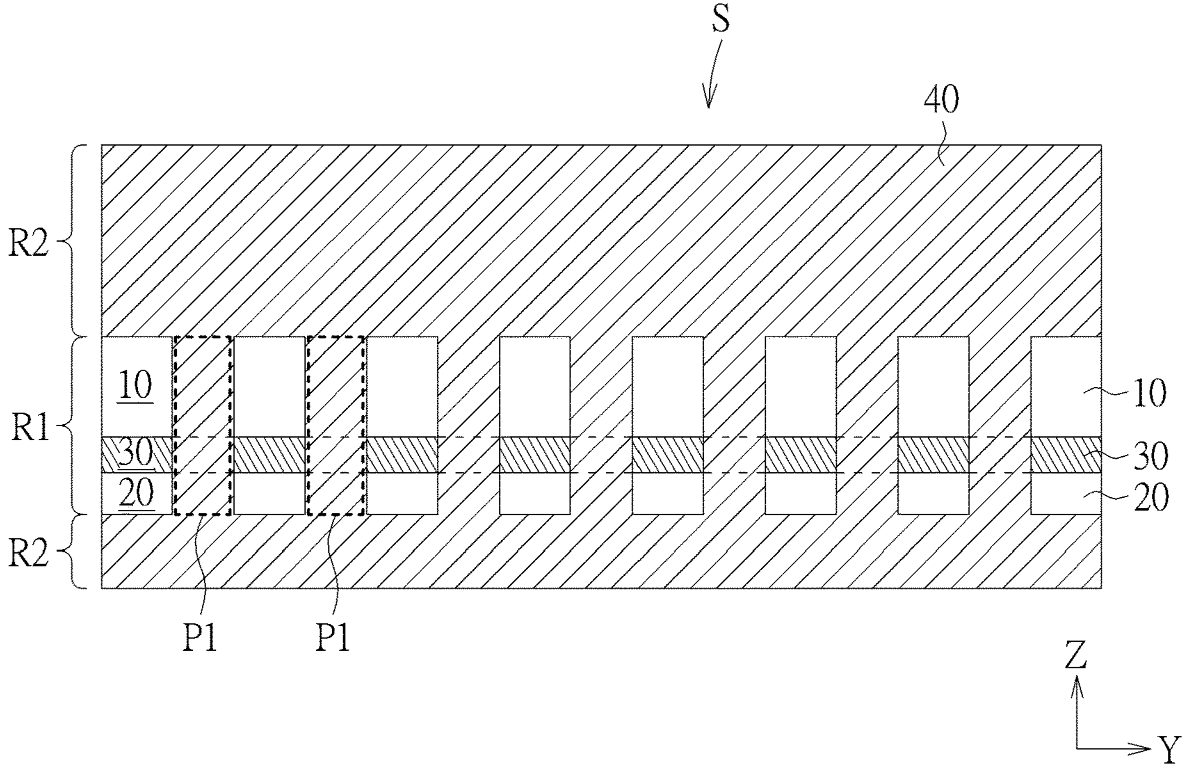
Figure 11:
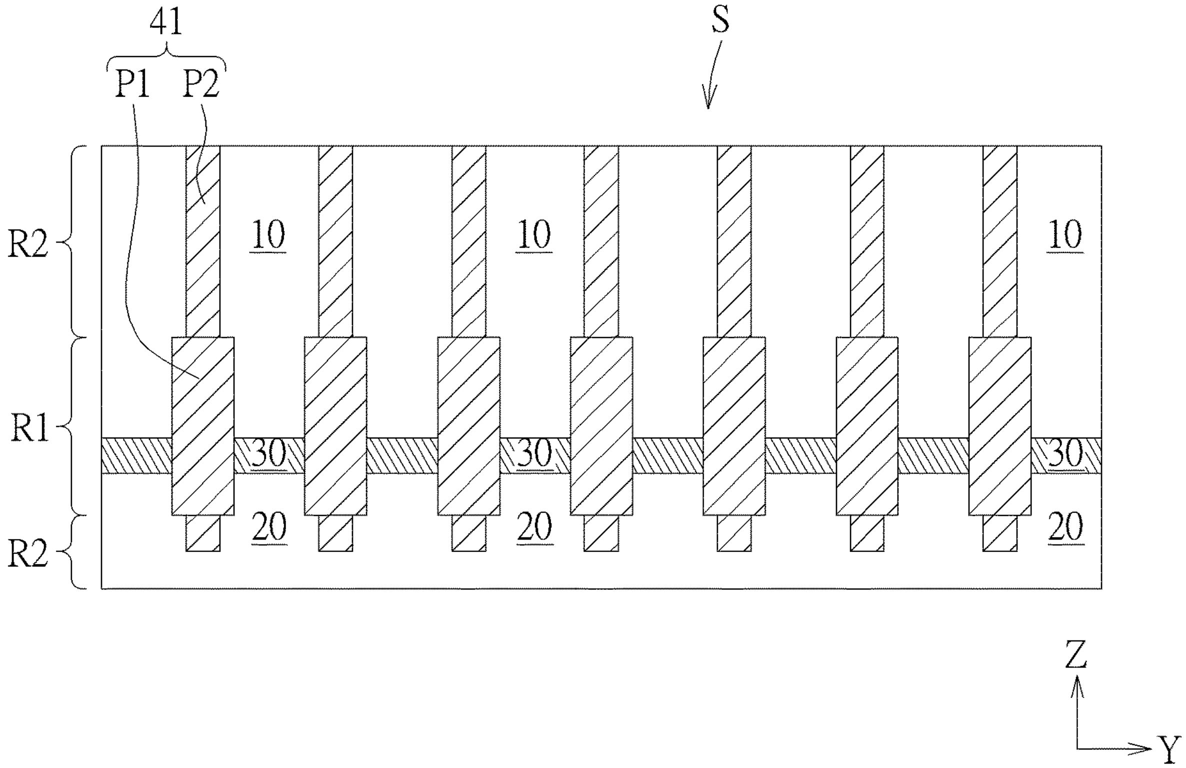

As shown in FIG. 10, the photoresist layer 62 in the first region R1 and the second region R2 is removed by a photoresist removing step, so that the conductive layer 40 is exposed. At this time, the exposed conductive layer 40 in the first region R1 can be used as the first portion P1 of the lateral wiring. Finally, as shown in FIG. 11, a second patterning process step, such as a laser ablation step, is used to remove part of the conductive layer 40 in the second region R2. After the laser ablation step, the conductive layer left in the second region R2 is the second portion P2 of the lateral wiring, and the first portion P1 and the second portion P2 are combined with each other to form a complete lateral wiring 41. In this embodiment, although the first portion P1 is formed by the first patterning process and the second portion P2 is formed by the second patterning process, however, the first portion P1 and the second portion P2 are still substantially connected with each other, and together form an integrally formed pattern.

As shown in FIGS. 7 to 11, in this embodiment, the first portion P1 of the lateral wiring 41 is formed by a first patterning process (such as a wet etching step in this embodiment, but not limited thereto), and the second portion P2 of the lateral wiring 41 is formed by a second patterning process (such as a laser ablation step in this embodiment, but not limited thereto). However, the flow described in FIG. 7-FIG. 11 above is only one of the methods for forming lateral wirings in this disclosure, and the following paragraphs will describe other methods for forming possible lateral wirings in this disclosure. For convenience of comparison, the same elements will be denoted by the same reference numerals.

In the first embodiment described above (the embodiment described in FIGS. 7 to 11), the first portion P1 of the lateral wiring 41 is patterned by a photo lithography step and an etching method, but in the second embodiment of the present disclosure, the first portion P1 may also be formed by a lift-off process. The difference from the first embodiment is that a photoresist layer (not shown) can be formed on the side surface S first, and then the photoresist layer in the first region R1 is patterned before the conductive layer 40 is formed to cover the photoresist layer. It is worth noting that in the first region R1, the region containing the photoresist layer after patterning is the region where the conductive layer 40 needs to be removed later (that is, the region where the first portion P1 is not formed). Next, the photoresist layer in the first region R1 is removed. When the photoresist layer is removed, the upper conductive layer 40 is also removed, and the patterned conductive layer 40 (i.e., the first portion P1) is left in the first region R1, and the patterned conductive layer as shown in FIG. 10 can also be obtained. The above steps are the lift-off process. Other methods of forming the second portion P2 can be the same as the above-mentioned first embodiment, and can be formed by a laser ablation step, so the details are not repeated here. In addition, the method of forming the second portion P2 can also be formed by a lift-off process, for example, the second portion P2 of the lateral wiring 41 can be formed by a photo lithography step and an etching method.

In the third embodiment of the present disclosure, the formation order of the first portion P1 and the second portion P2 can be reversed, that is, the second portion P2 of the lateral wiring 41 can be formed first (for example, but not limited to laser etching) before the first portion P1 of the lateral wiring 41 is formed (for example, but not limited to photo lithography development and etching). Such an embodiment is also within the scope of this disclosure.

In the fourth embodiment of the present disclosure, different materials can be used to form different portions of the lateral wirings 41. For example, a first metal material can be combined with the first patterning process to form the first portion P1 of the lateral wiring 41, and then a second metal material can be combined with the second patterning process to form the second portion P2 of the lateral wiring 41. In this embodiment, the sputter method can be used to form more than two different metal material layers. Since sputtering and other technologies belong to the known technology in this field, so thy will not be repeated here. In addition, the first patterning process of this fourth embodiment can use photo lithography step and etching method, and the second patterning process can use laser ablation process, or the first patterning process can use laser ablation process, and the second patterning process can use laser ablation process. In short, the first patterning process is different from the second patterning process, and furthermore, the first patterning process can be implemented before or after the second patterning process. This implementation is also within the scope of the present disclosure. Adjusting the sequence of process execution according to the types of the first patterning process and the second patterning process can improve the yield according to the cost consideration, process difficulty, process corresponding conditions and materials. For example, if the first patterning process is a photo lithography step and etching method, and the second patterning process is a laser ablation process, in one embodiment, the first patterning process can achieve the effect of protecting the adhesive layer 30 when the second patterning process is performed. Because the fourth embodiment uses different materials to form different parts of the lateral wiring 41, the joint of the first portion P1 and the second portion P2 will overlap each other to form an up-and-down stacked structure.

In addition to several possible implementation methods listed above, other possible variations or combinations should also fall within the scope of this disclosure. For example, combining the third embodiment with the fourth embodiment, first forming the second portion P2 with one metal material, and then forming the first portion P1 with another metal material. This combined embodiment also falls within the scope of this disclosure. In another embodiment, the materials of the first portion P1 and the second portion P2 are different.

Based on the above description and drawings, the present disclosure provides a manufacturing method of an electronic device, which includes providing a first substrate 10, providing a second substrate 20, bonding the first substrate 10 and the second substrate 20 through an adhesive layer 30 to form a substrate structure, then forming a conductive layer 40 on the side surface of the first substrate 10, the side surface of the second substrate 20 and the side surface of the adhesive layer 30, performing a first patterning process on a first region R1 of the conductive layer 40, and performing a second patterning process on a second region R2 of the conductive layer 40, the first region R1 at least partially overlaps the adhesive layer 30, and the second region R2 overlaps the side surfaces of the first substrate 10 and the second substrate 20. The first patterning process is different from the second patterning process (refer to FIGS. 7-11 together).

In some embodiments of the present disclosure, the first patterning process is a photo lithography process and the second patterning process is a laser ablation process.

In some embodiments of the present disclosure, the step of performing the first patterning process is before performing the second patterning process (such as the first embodiment described in FIGS. 7-11).

In some embodiments of the present disclosure, the step of performing the first patterning process is after performing the second patterning process (such as the third embodiment described in the above paragraph).

In some embodiments of the present disclosure, performing the first patterning process includes forming a photoresist layer 62 on the conductive layer 40, patterning the photoresist layer 62, etching the conductive layer 40 with the photoresist layer 62 as a mask, and removing the photoresist layer 62.

In some embodiments of the present disclosure, before the step of forming the conductive layer 40, it further includes forming a photoresist layer on the side surface of the first substrate 10, the side surface of the second substrate 20 and the side surface of the adhesive layer 30, and patterning the photoresist layer (for example, the second embodiment described in the above paragraph).

In some embodiments of the present disclosure, the first patterning process is a lift-off process.

The present disclosure provides an electronic device, which comprises a first substrate 10, a second substrate 20, an adhesive layer 30, and a lateral wiring 41, which is arranged on the side surfaces of the first substrate 10 and the adhesive layer 30, and has a first portion P1 and a second portion P2. The first portion P1 at least partially overlaps the adhesive layer 30 and the second portion P2. The first portion P1 and the second portion P2 respectively have a first edge E1 and a second edge E2 extending along a first direction D1 (the Z direction in FIG. 2), and the first edge E1 and the second edge E2 are separated from each other, the first direction D1 is the arrangement direction of the first substrate 10 and the second substrate 20 (the Z direction in FIG. 2).

In some embodiments of the present disclosure, the first portion P1 and the second portion P2 of the lateral wiring comprise different materials.

In some embodiments of the present disclosure, the first direction D1 may be parallel to the arrangement direction of the first substrate 10 and the second substrate 20, and in other embodiments, the first direction D1 may be parallel to a connecting line between the first substrate 10 and the second substrate 20 (e.g., the Z direction in FIG. 2).

In some embodiments of the present disclosure, the first edge E1 and the second edge E2 are separated from each other by a first pitch G1, and the first pitch is between 5 and 15 microns.

In some embodiments of the present disclosure, the first portion P1 and the second portion P2 respectively have a third edge E3 and a fourth edge E4 extending along the first direction (the Z direction in FIG. 2), the first edge E1 is opposite to the third edge E3, the second edge E2 is opposite to the fourth edge E4, and the third edge E3 and the fourth edge E4 are separated from each other.

In some embodiments of the present disclosure, the third edge E3 and the fourth edge E4 are separated from each other by a second pitch G2, and the second pitch G2 is between 5 and 15 microns.

In some embodiments of the present disclosure, the difference between the first pitch and the second pitch is greater than or equal to zero.

In some embodiments of the present disclosure, the distance between the first portion P1 and an edge of the side surface of the first substrate 10 (i.e., the upper edge in FIG. 2) is greater than 80 microns.

In some embodiments of the present disclosure, the distance between the first portion P1 and an edge of the side surface of the second substrate 20 (i.e., the lower edge in FIG. 2) is greater than 80 microns.

In some embodiments of the present disclosure, a length L1 of the first portion is greater than 600 microns.

The present disclosure also provides an electronic device, which comprises a first substrate 10, a second substrate 20, an adhesive layer 30, and a lateral wiring 41, which is arranged on the side surfaces of the first substrate 10 and the adhesive layer 30, and has a first portion P1 and a second portion P2, the first portion P1 at least partially overlaps the adhesive layer 30, and the second portion P2 overlaps the side surface of the first substrate 10. The region of the side surface of the first substrate 10 where the lateral wirings 41 are not covered has a third region R3 adjacent to the first portion P1 and a fourth region R4 adjacent to the second portion P2, and there is a height difference H1 between the third region R3 and the fourth region R4.

In some embodiments of the present disclosure, the roughness of the fourth region R4 is greater than the roughness of the third region R3.

In some embodiments of the present disclosure, the height difference H1 is less than 10 microns.

In some embodiments of the present disclosure, the surface of the first portion P1 is aligned with the surface of the second portion P2 (as shown in FIG. 5), or the height difference between the surface of the first portion 10 and the surface of the second portion 20 is less than 5 microns.

The feature among that embodiments of the present disclosure can be mix and matched at will as long as they do not violate the disclosure spirit or conflict with each other.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a first substrate;
a second substrate;
an adhesive layer arranged between the first substrate and the second substrate; and
a lateral wiring arranged on a side surface of the first substrate and a side surface of the adhesive layer, the lateral wiring having a first portion and a second portion;
wherein the first portion at least partially overlaps the adhesive layer, and the second portion overlaps a part of the side surface of the first substrate, a region of the side surface of the first substrate without the lateral wiring has a third region adjacent to the first portion and a fourth region adjacent to the second portion, and there is a height difference between the third region and the fourth region, wherein a height difference between a surface of the first portion and a surface of the second portion is less than 5 microns.

2. An electronic device, comprising:
a first substrate;
a second substrate;
an adhesive layer arranged between the first substrate and the second substrate; and
a lateral wiring arranged on a side surface of the first substrate and a side surface of the adhesive layer, the lateral wiring having a first portion and a second portion; wherein the first portion at least partially overlaps the adhesive layer, the second portion overlaps a part of the side surface of the first substrate, a region of the side surface of the first substrate without the lateral wiring has a third region adjacent to the first portion and a fourth region adjacent to the second portion, and there is a height difference between the third region and the fourth region, wherein a roughness of the fourth region is greater than a roughness of the third region.

3. An electronic device, comprising:
a first substrate;
a second substrate;
an adhesive layer arranged between the first substrate and the second substrate; and
a lateral wiring arranged on a side surface of the first substrate and a side surface of the adhesive layer, the lateral wiring having a first portion and a second portion; wherein the first portion at least partially overlaps the adhesive layer, the second portion overlaps a part of the side surface of the first substrate, a region of the side surface of the first substrate without the lateral wiring has a third region adjacent to the first portion and a fourth region adjacent to the second portion, and there is a height difference between the third region and the fourth region, wherein the height difference is less than 10 microns.

* * * * *